Nov. 13, 1956 C. F. CHONG 2,770,732

TRANSISTOR MULTIVIBRATOR CIRCUIT

Filed July 8, 1955

INVENTOR.
CARLOS F. CHONG
BY H. L. Newton
ATTORNEY.

United States Patent Office 2,770,732

Patented Nov. 13, 1956

2,770,732

TRANSISTOR MULTIVIBRATOR CIRCUIT

Carlos F. Chong, Philadelphia, Pa., assignor to Radio Corporation of America, a corporation of Delaware Application July 8, 1955, Serial No. 520,706

6 Claims. (Cl. 250—36)

Figure 1:
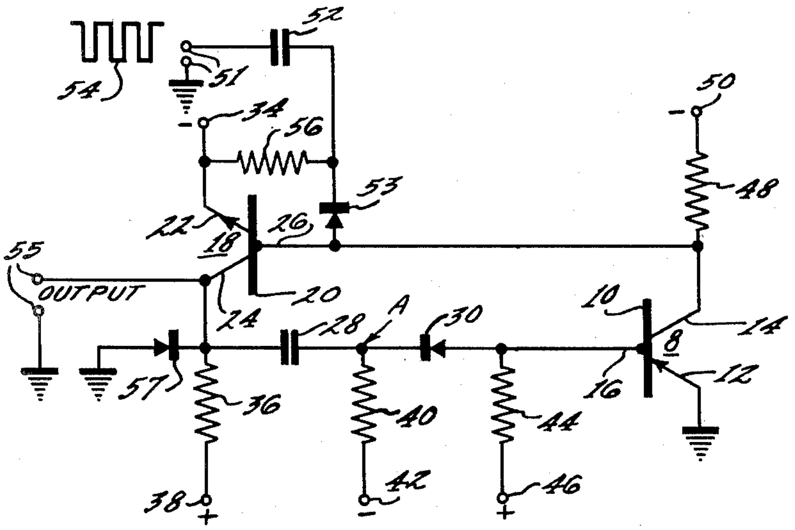

This invention relates in general to semi-conductor multivibrator circuits, and in particular to monostable multivibrator circuits utilizing transistors.

A multivibrator circuit is a relaxation oscillator and may be classified according to its operation into three different types. One type of multivibrator may be arranged to be free-running or self-oscillating at a predetermined frequency. The other two types of multivibrators have to be triggered by the application of electrical pulses. Thus, the multivibrator may be monostable or of the one-cycle type. In other words, when the multivibrator is triggered it will go through one cycle of oscillation and thereafter returns to the original stable state of oscillation. The multivibrator remains in the stable state until it is triggered again by the next pulse.

Monostable multivibrator circuits employing electron discharge devices or tubes are well known. In one type, the grid and anodes of a pair of tubes are intercoupled and the circuit arrangement is such that an output pulse is generated following the application of a trigger pulse to the circuit. The duration of the output pulse is determined by a timing circuit which usually consists of a timing capacitor and a timing resistor in the circuit coupling the anode of the first multivibrator tube to the grid of the second multivibrator tube. The first tube is normally cut-off and the second tube is normally conducting. The trigger pulses reverse the conductivity, as a result of which the first tube conducts for a period of time determined by the time constant of the timing circuit.

Multivibrator circuits which employ semi-conductor devices such as transistors are also well known. In one type, which is the analog of the tube circuit described above, a pair of transistors of the same conductivity type may have their collector and base electrodes intercoupled. In a manner similar to the tube circuit, the circuit arrangement is such that an output pulse is generated following the application of a trigger pulse to the circuit. The duration of the output pulse is determined by a timing circuit which is in the circuit coupling the collector electrode of the first transistor with the base of the second transistor.

For such applications, in order to insure reliable circuit operation, the discharge time of the timing circuit should be relatively fast. In addition, the charge time should be substantially constant. For the tube multivibrator circuits, these requirements are generally readily obtainable because tubes have a high input impedance. The input impedance of a transistor, however, is generally relatively low and these requirements are not easily obtainable.

It is also desirable that the voltage required for triggering a multivibrator circuit be kept at a minimum. In addition, the output pulses which are derived from the circuit should preferably be standardized as to amplitude and width, that is, the circuit operation should be such that uniform output pulses are obtainable. Although these features of a multivibrator circuit are desirable, they should preferably not be obtained at the cost of circuit stability.

It is an object of the present invention to provide an improved monostable multivibrator circuit utilizing opposite conductivity type transistors wherein the circuit timing capacitor is discharged very rapidly through the transistors to provide reliable circuit operation in response to relatively low voltage trigger pulses.

It is another object of this invention to provide an improved and efficient monostable multivibrator circuit utilizing a pair of intercoupled transistors of opposite conductivity types wherein the circuit may be triggered by relatively low voltage pulses and the resulting circuit operation is stable.

It is a still further object of the present invention to provide an improved and stable monostable multivibrator circuit utilizing a pair of opposite conductivity type transistors wherein uniform output pulses are provided in response to trigger pulses of relatively low voltage.

These and further objects and advantages of the present invention are achieved in a circuit arrangement employing a pair of transistors which are of opposite conductivity or complementary symmetry types. The base of the first transistor is coupled through a timing circuit including a capacitor to the collector of the second transistor. The base of the second transistor is directly coupled to the collector of the first transistor. In accordance with the invention, a unilateral conducting element, such as a diode, is connected in the collector circuit of the second transistor. This permits the circuit to be triggered with relatively low voltage pulses. Upon the application of a trigger pulse to the circuit, the circut operation is such that the timing circuit capacitor is discharged through a series path which includes both transistors. The diode in the collector circuit of the second transistor accelerates this discharge and, in addition, insures the development of uniform output pulses. This type of circuit arrangement provides circuit operation which is reliable and stable.

Figure 2:
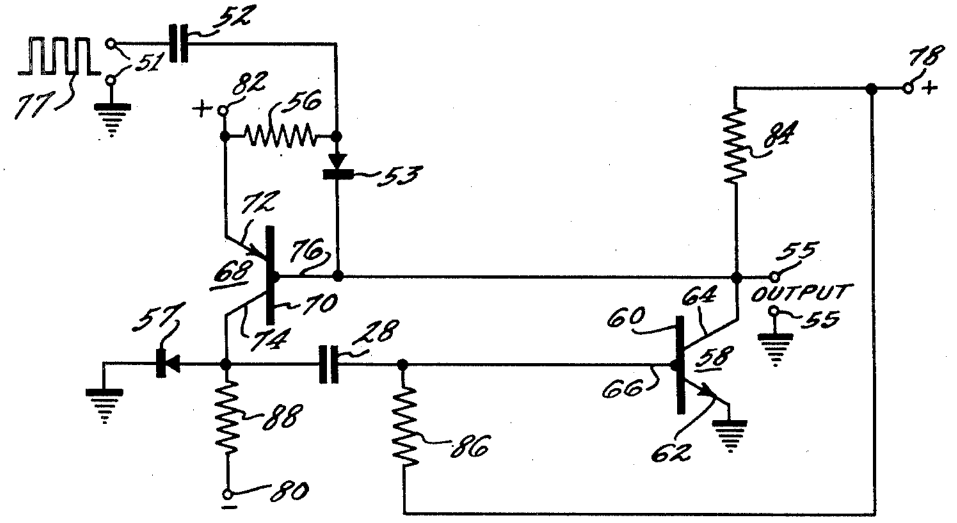

The novel features that are considered characteristic of this invention are set forth with particularity in the appended claims. The invention itself, however, both as to its organization and method of operation, as well as additional objects and advantages thereof, will best be understood from the following description when considered in connection with the accompanying drawings, in which:

Figures 1 and 2 are schematic circuit diagrams of monostable multivibrator circuits utilizing a pair of opposite conductivity type transistors and embodying the invention.

Referring now to the drawing, wherein like parts are indicated by like reference numerals in both figures, and referring particularly to Figure 1, a monostable multivibrator circuit includes a pair of transistors 8 and 18 of opposite conductivity types and which may be considered to be, by way of example, a P-N-B junction transistor and an N-P-N junction transistor, respectively. Each of the transistors 8 and 18 comprises a semi-conductive body with which three electrodes are cooperatively associated in a well known manner. Thus, the P-N-P transistor 8 includes a semi-conductive body 10 and an emitter 12, a collector 14 and a base 16. In the same manner, the N-P-N transistor 18 includes a semi-conductive body 20 and an emitter 22, a collector 24 and a base 26.

Intercoupling of the electrodes of the two transistors is provided by connecting the collector 14 of the P-N-P transistor 8 directly with the base 26 of the N-P-N transistor 18. In addition, the collector 24 of the N-P-N transistor 28 is returned through a storage capacitor 28 and a diode 30 to the base 16 of the P-N-P transistor 8.

For normal amplifying action of a transistor, it is generally required that the bias voltage which is supplied between the emitter and base electrodes be in the forward or relatively conducting direction and that the biasing voltage which is applied between the collector and base be in the reverse or non-conducting direction. Thus, for a transistor of N type conductivity this means that the collector will be negative with respect to the base, while the emitter will be positive, also with respect to the base. For a transistor of P type conductivity on the other hand, the collector will be positive with respect to the base, while the emitter will be negative with respect to the base. The biasing voltages for the transistors in the circuits embodying the invention are of these polarities. Thus, the emitter 22 of the N-P-N transistor 18 is connected to a terminal 34, which will normally be connected to the negative terminal of a source of direct current potential, such as a battery. The collector 24 of the N-P-N transistor is, on the other hand, connected through a resistor 36 to a terminal 38, which will normally be connected to the positive terminal of a source of direct current potential. When the transistors are conductive, base bias for the P-N-P transistor 8 and a forward bias for the diode 30 is obtained by the connection from the junction of the diode 30 and the capacitor 28, including the resistor 40, to a terminal 42 which will normally be connected to the negative terminal of the supply voltage.

When the transistor 8 is non-conductive, the bias between its emitter and base is slightly in the reverse direction, since it is obtained by the connection from the base 16, including a resistor 44, to the terminal 46, which is connected to the positive terminal of a relatively small source of direct current voltage. The emitter 12 of the transistor 8 is connected to a point of fixed reference potential or ground for the system, while the collector 14 of this transistor is connected through a resistor 48 to a terminal 50, which may be connected to the negative terminal of the supply voltage.

Input trigger pulses may be applied to the circuit at any convenient point such as through a pair of terminals 51, one of which is grounded as shown and the other of which is connected through a capacitor 52 and pulse steering diode 53 to the base 26 of the N-P-N transistor 18. The diode 53 is provided with a small amount of forward bias by returning its cathode through a resistor 56 to the negative terminal 34. The trigger pulses 54 may be of a negative polarity or may be alternately positive and negative as desired. In some instances, when a source of negative trigger pulses is provided, the diode 53 will not be necessary. Output pulses may be taken from any convenient point in the circuit, such as, for example, a pair of output terminals 55, one of which is grounded and the other of which is connected with the collector 24 of the N-P-N transistor 18.

To complete the circuit and to provide (1) very rapid discharge of the capacitor 28, (2) minimum voltage triggering requirements, (3) improved stability of the circuit operation, and (4) the production of substantially uniform output pulses, a unilateral conducting element is connected, in accordance with the invention, in the collector circuit of the transistor through which the coupling capacitor discharges. To this end, and in accordance with the teachings of this invention, a diode 57 is connected from the junction of the collector 24 of the N-P-N transistor 18 and the resistor 36 to a point of reference potential such as ground. The diode 57 is poled for forward conduction in the same direction as that of normal collector current of the transistor through which the coupling capacitor is discharged. Accordingly, in Figure 2 the cathode of the diode 57 is connected with the collector 24 and its anode is grounded.

In operation, consider that both transistors 8 and 18 are conducting. In this condition, negative base bias for the P-N-P transistor 8 is obtained from the terminal 42 so that a forward bias exists between the emitter 12 and the base 16. When a negative input or trigger pulse 54 is applied at the terminals 51 and to the base 26, the N-P-N transistor 18 is rendered non-conductive. The voltage on the collector 24 of the N-P-N transistor then becomes positive, which means that the point A, which is intermediate the storage capacitor 28 and the diode 30 becomes positive. Thus, the diode 30 is biased in the reverse direction and an open circuit exists between the terminal 42 and the base 16. In this manner, the biasing voltage on the base 16 is obtained from the terminal 46 and the P-N-P transistor 8 is biased off. The potential at the collector 14 of the P-N-P transistor decreases towards the potential which is applied at the terminal 50 and the N-P-N transistor 18 remains non-conductive.

With both transistors in the non-conducting condition following the application of the negative trigger pulse, the storage capacitor 28 begins to charge through the resistor 36 in series with the resistor 40. Eventually, due to the charging of the capacitor 28, the point A becomes sufficiently negative to bias the diode 30 in the forward direction and the capacitor 28 charges through the resistor 36 in series with the parallel combination of the resistors 40 and 44. When the potential on the base 16 of the P-N-P transistor becomes sufficiently negative, the P-N-P transistor 8 will begin to conduct. The collector 14 of the transistor 8 then becomes less negative and the N-P-N transistor 18 will begin to conduct. The capacitor 28 then discharges very rapidly through a series path comprising the emitter and base of the P-N-P transistor 8, the diode 30 and the collector and emitter electrodes of the N-P-N transistor 18.

The diode 57 which is connected, in accordance with the invention, with the collector 24 of the N-P-N transistor 18, prevents the transistor 18 from reaching a condition of collector saturation. This provides, in operation, two distinct advantages. For one, it permits the circuit to be triggered by relatively low voltage trigger pulses. The second advantage is that since the transistor 18 is kept out of saturation, the circuit operation is stabilized. In addition to these advantages, the diode 57 permits the coupling capacitor 28 to be discharged faster than in the case when the diode is omitted from the circuit. Moreover, since the diode 57 clamps the collector 24 of the transistor 18 to ground potential, the output pulses which are derived from the output terminals 55 will be uniform in amplitude and width.

As described, therefore, it is seen that by connecting a diode in the collector circuit of the discharge transistor of a monstable multivibrator circuit in which opposite conductivity transistors are used, a relatively large ratio of charge to discharge time of the coupling capacitor is readily obtainable. In addition, circuit operation is stable and is initiated by relatively low voltage trigger pulses. The output pulses obtainable are, moreover, uniform in amplitude and width.

By adjusting the time constant that determines the charge time of the storage capacitor 28, a specific number of input trigger pulses can be applied to the terminals 51 without providing the circuit operation as described. Then, after the application of a predetermined number of pulses, the circuit operation will be as described above. Thus, a monostable multivibrator in accordance with the invention can be utilized as a frequency divider for counter applications. Other uses of such a circuit, such as a synchronizing generator in a television transmitter, will be obvious to those skilled in the art. As is well known, monostable multivibrator circuits have many applications and are used in a wide variety of electrical equipment.

While it will be understood that the circuit specifications may vary according to the design for any particular application, the following circuit specifications are included by way of example only. For these circuit specifications, the voltages which are applied to the terminals 34, 38, 42, 46 and 50 are −1.5, +10.5, −33, +½ and −10½ volts respectively.

| | |
|---|---|
| Resistors **36**, **40**, **44** and **48** | 3300; 120,000; 6000; and 3900 ohms respectively. |
| Capacitor **28** | 0.01 microfarads. |

A circuit of the type described is not restricted to junction transistors, although transistors of this type are generally to be preferred. Moreover, the specific conductivity types of the transistors used are not critical so long as they are of opposite conductivity types, as will be seen from a consideration of Figure 2.

Referring now to Figure 2, a monostable multivibrator circuit of the same general type as the circuit illustrated in Figure 1 includes a pair of transistors 58 and 68 which may be considered to be, by way of example, an N-P-N junction transistor and a P-N-P junction transistor, respectively. Each of the transistors includes a semiconductive body and three electrodes which are cooperatively associated with the body in a well known manner. Thus, the transistor 58 includes a semi-conductive body 60 and an emitter 62, a collector 64 and a base 66. In the same manner, the transistor 68 includes a semiconductive body 70 and an emitter 72, a collector 74 and a base 76. In the embodiment of the invention illustrated in Figure 2, the input trigger pulses 77 are of a positive polarity and are applied to the base 76 of the P-N-P transistor 68, through the diode 53 which is poled in an opposite direction to its counterpart in Figure 1. It should be understood that the circuit operation may be initiated by applying the trigger pulses to any electrode of either transistor.

Another difference in the circuit illustrated in Figure 2 is that the diode has been eliminated in the connection between the collector of the discharge transistor and the base of the first transistor. Generally, the inclusion of the diode is to be preferred, since it insures that the first transistor remains non-conductive while the capacitor 28 charges. It should be understood, however, that the diode is not necessary for the proper operation of the circuit. If the diode were used in Figure 2, it would be reversed in polarity and a connection from a negative source of potential would be needed to the junction of the diode and the base 66 of the N-P-N transistor. Since the conductivity of the transistors has been reversed, the polarity of the various biasing potentials has also been reversed. To obtain the required biasing potentials, three terminals 78, 80 and 82 are provided. The terminal 78 will normally be connected to the positive terminal of a source of direct current potential and supplies collector and base biasing potentials for the N-P-N transistor 58. To this end, the terminal 78 is connected through a resistor 84 to the collector 64 and through a resistor 86 to the base 66 of the transistor 58. A resistor 88 is connected in series between the collector 74 of the P-N-P transistor 68 and the terminal 80 which is connected in turn to the negative terminal of a source of direct current potential. To supply emitter bias for the transistor 68, its emitter 72 is connected directly with the terminal 82, which is connected to the positive terminal of a direct current biasing supply.

Output pulses may be derived from the collector circuit of the N-P-N transistor 58. To this end, the ungrounded output terminal 55 is connected directly with the collector 64 of the transistor 58. Another difference in the circuit illustrated in Figure 2 is that the diode 57, since it is connected in the collector circuit of a P-N-P transistor, has been reversed in polarity from its counterpart in Figure 1. In operation, the circuit illustrated in Figure 2 will be substantially identical to the one illustrated in Figure 1 except, of course, that the polarity of the various circuit potentials will be reversed. Since, however, the diode 30 has been eliminated, the transistor 58 remains non-conductive prior to the charging of the capacitor 28 due to the negative voltage at point A following the application of a trigger pulse to the circuit. The diode 57, moreover, provides the same advantages of operation. Hence the discharge of the capacitor 28 is very rapid, low voltage trigger pulses can be used, circuit operation is stabilized and the output pulses obtained are standard in amplitude and width.

As described herein, a monostable multivibrator circuit constructed in accordance with the invention is stable and efficient in operation. The ratio of charge to discharge time of the timing capacitor is relatively large, and low voltage trigger pulses can be used to initiate circuit operation. Thus, by provision of the invention, a multivibrator is provided which may find wide use wherever reliable and stable circuit operation is desired or required.

What is claimed is:

1. A multivibrator circuit comprising, a first and a second semi-conductor device of opposite conductivity types each including a base, an emitter and a collector electrode, means providing a direct current conductive connection between the collector of said first semi-conductor device and the base of said second semi-conductor device, means including an electrical storage element coupling the base of said first semi-conductor device with the collector of said second semi-conductor device, means providing a conductive charging path for said storage element, circuit means for receiving trigger pulses in said multivibrator circuit for rendering said semi-conductor devices non-conductive and to charge said storage element through said charging path, and a unilateral conducting element connected with the collector of said second semi-conductor device and poled for providing rapid discharge of said storage element through said devices and stable operation of said multivibrator circuit.

2. A monostable multivibrator circuit comprising, a first junction transistor of one conductivity type having a first base, a first emitter and a first collector electrode, a second junction transistor of an opposite conductivity type having a second base, a second emitter and a second collector electrode, conductive circuit means directly connecting said first collector with said second base, means including a serially connected first unilateral conducting element and a storage capacitor connecting said first base with said second collector, means providing a conductive charge path for said storage element and forward biasing potentials for said unilateral conducting element connected with a point intermediate said storage capacitor and said unilateral conducting element, circuit means for receiving trigger pulses in said multivibrator circuit to render said transistors non-conductive and to charge said storage element, a second unilateral conducting element connected with the collector of said second transistor and poled for providing rapid discharge of said capacitor through said devices, and output circuit means connected with said second collector electrode for deriving an output voltage wave therefrom.

3. A multivibrator circuit comprising, a first and a second semi-conductor device of opposite conductivity types each including a base, an emitter and a collector electrode, means connecting the collector of said first semi-conductor device with the base of said second semi-conductor device, means including an electrical storage element coupling the base of said first semiconductor device with the collector of said second semi-conductor device, circuit means for receiving trigger pulses in said multivibrator circuit whereby said storage element is charged, and a diode connected with the collector of said second semi-conductor device for providing rapid discharge of said storage element through said semi-conductor devices.

4. A monostable multivibrator circuit including means providing a point of reference potential therein comprising, a first and a second semi-conductor device of opposite conductivity types each including a base, an emitter and a collector electrode, means providing a direct current conductive connection between the collector of said first semi-conductor device and the base of said second semi-conductor device, means including a serially connected first diode and a storage capacitor connecting the base of said first semi-conductor device with the collector of said second semi-conductor device, means providing a first source of potential connected with the base electrode of said first device for applying a biasing voltage in the reverse direction between the emitter and base electrodes of said first device when it is non-conductive, means including a second source of potential connected with the junction of said diode and said capacitor for charging said capacitor when said devices are non-conductive and for applying a biasing voltage in the forward direction between the emitter and base electrodes of said first device when said capacitor is charged to render said first and second devices conductive, means for applying relatively low voltage trigger pulses to the base of said second semi-conductor device for rendering said semi-conductor devices non-conductive whereby said storage capacitor is charged, and a diode poled for forward conduction in the same direction as normal collector current flow of said second semi-conductor device directly connected between the collector of said second device and said point of reference potential to provide rapid discharge of said capacitor through said semi-conductor devices and stable operation of said multivibrator circuit.

5. A multivibrator circuit comprising, a pair of transistors of opposite conductivity types each of which includes a base, an emitter and a collector electrode, means interconnecting the electrodes of said transistors whereby said transistors are simultaneously conductive and in response to input pulses simultaneously non-conductive, said last named means including a storage element connected in circuit between the collector electrode of one of said transistors and the base electrode of the other of said transistors, and a unilateral conducting element directly connected with the collector electrode of said one of said transistors.

6. A monostable multivibrator circuit comprising, a first transistor of one conductivity type including a first base, a first emitter and a first collector electrode, a second transistor of an opposite conductivity type including a second base, a second emitter and a second collector electrode, means providing a direct current conductive connection between said first collector and said second base, a storage capacitor serially connected between said first base and said second collector, means providing a first, a second and a third source of operating voltage, said first and third source being of the same polarity and of an opposite polarity to said second source, means connecting said first source with said first collector and with said first base, means connecting said second source with said first collector, means connecting said third source with said second collector, means providing an input circuit for applying trigger pulses of a predetermined polarity to said second base to render said first and second transistors non-conductive thereby to charge said storage capacitor, said first and second transistors being rendered conductive when said storage capacitor is charged, and a diode directly connected with said second collector and poled to provide rapid discharge of said storage capacitor through said transistors when said transistors are conductive.

References Cited in the file of this patent

UNITED STATES PATENTS 2,705,287 Lo ------------------ Mar. 29, 1955

OTHER REFERENCES

"Complementary Symmetry Transistor Circuits," by Lohman, pp. 140–43 of Electronics for September 1953.